United States Patent [19]

Onodera

[11] Patent Number: 5,318,632
[45] Date of Patent: Jun. 7, 1994

[54] WAFER PROCESS TUBE APPARATUS AND METHOD FOR VERTICAL FURNACES

[75] Inventor: Kiyoshi Onodera, Tokyo, Japan

[73] Assignee: Kawasaki Steel Corporation, Kobe, Japan

[21] Appl. No.: 65,290

[22] Filed: May 21, 1993

[30] Foreign Application Priority Data

May 25, 1992 [JP] Japan .................................. 4-132628
May 27, 1992 [JP] Japan .................................. 4-135310

[51] Int. Cl.⁵ .............................................. C23C 16/00
[52] U.S. Cl. .................................... 118/715; 156/345; 427/248.1
[58] Field of Search .......................... 118/715; 156/345; 427/248.1

[56] References Cited

U.S. PATENT DOCUMENTS 4,640,223  2/1987  Dozier ................................. 118/725

FOREIGN PATENT DOCUMENTS 385382  2/1990  European Pat. Off. .

Primary Examiner—Richard Bueker
Attorney, Agent, or Firm—Gerald E. Lester; Gordon T. Arnold

[57] ABSTRACT

A cap inserted into a wafer process tube for vertical furnaces is provided with exhaust flow normalizing means which can control or prevent variations in exhaust flow rates in the process tube, and thereby control variations in thickness of wafers subjected to film forming and annealing.

In the alternative, an annular hollow ring is hermetically sealed around an outer circumferential surface of the process tube. An exhaust pipe is connected to the hollow annular ring. Gas communication holes are formed in the wall of the process tube to accommodate the flow of gas between the tube and the hollow annular ring. The spacing and cross-sectional area of the communication holes are such as to equalize flow resistance circumferentially around the cap. In-plane variations and wafer to wafer variations in thickness and quality of wafers subjected to film forming and annealing thereby are reduced and controlled.

23 Claims, 7 Drawing Sheets

PRIOR ART

WAFER PROCESS TUBE APPARATUS AND METHOD FOR VERTICAL FURNACES

FIELD OF THE INVENTION

The present invention relates to an improved wafer process tube apparatus and method for substantially normalizing and controlling gas flow rates in vertical furnaces (e.g., vertical heat treatment furnaces, vertical oxidation furnaces, and vertical diffusion furnaces) such as those used in the semiconductor production process, and more particularly to a process tube apparatus and method which can reduce in-plane variations and wafer to wafer variations in thickness and quality of thin films formed on semi-conductor wafers and of semi-conductor wafers annealed within such vertical furnaces.

DESCRIPTION OF BACKGROUND ART

Figure 12:
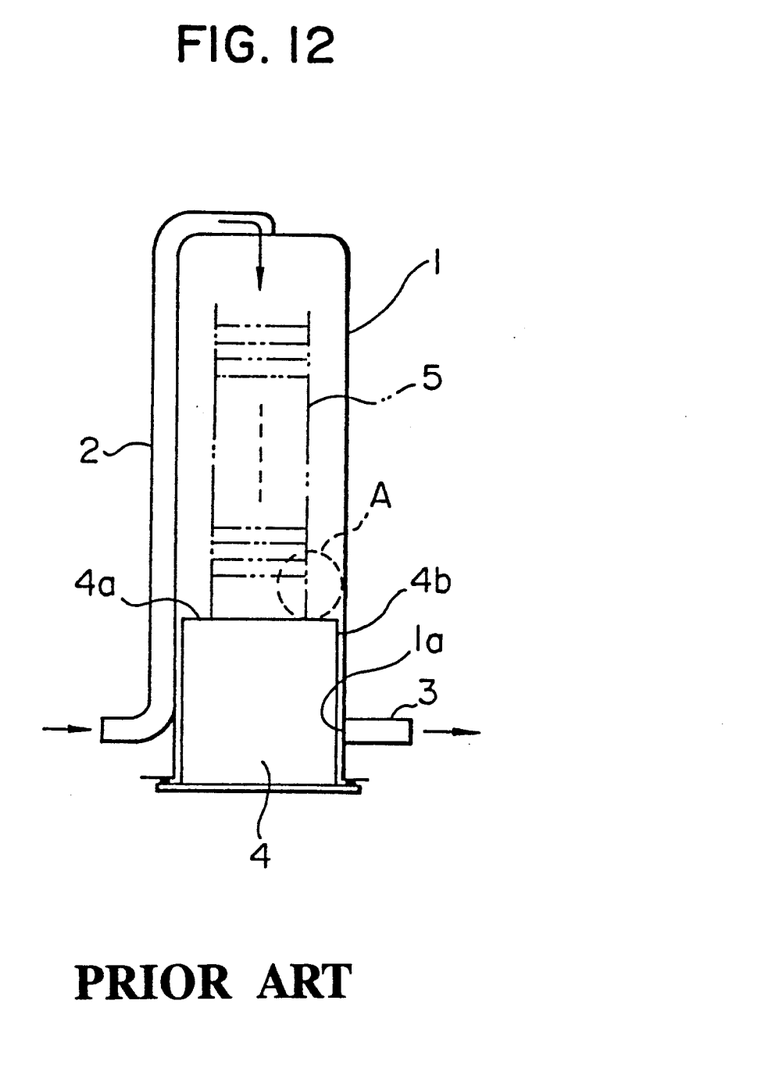
FIG. 12 is a side view diagram of a prior art process tube used in vertical furnaces.

FIG. 12 is a side view diagram by way of example, of a conventional process tube 1 for use in vertical furnaces.

The process tube 1 for vertical furnaces is of a quartz-made cylinder with its upper end closed and its lower end left open. A process gas introducing pipe 2 is connected to the center of an upper end portion of the process tube 1 for communication with an inner cavity of the process tube, and an exhaust pipe 3 is connected to a peripheral wall of the process tube 1 at a position near its lower end for communication with the tube's inner cavity through an exhaust port 1a formed at the same position.

A cap 4 is inserted into the lower open end of the process tube 1 for vertical furnaces while leaving an appropriate gap between itself and an inner circumferential surface of the process tube 1 for vertical furnaces. A wafer mount boat 5 is supported to an upper end surface 4a of the cap 4 directed toward the inner cavity of the process tube 1.

In other words, the cap 4 is supported at its lower end by a lifting device (not shown) and inserted into the process tube 1 for vertical furnaces from below, with the wafer mount boat 5 kept supported on the upper end surface 4a of the cap 4.

The cap 4 is inserted into the process tube 1 such that the upper end surface 4a is positioned above the exhaust port 1a. Thus, during the process carried out in the vertical furnace, the exhaust port 1a of the process tube 1 faces an outer circumferential surface 4b of the cap 4.

Accordingly, gas supplied to the process tube 1 via the process gas introducing pipe 2 flows downwardly and reaches the exhaust port 1a after passing the gap between the inner circumferential surface of the process tube 1 and the outer circumferential surface 4b of the cap 4, following which the gas is discharged to the exterior via the exhaust pipe 3.

In the above conventional process tube 1 for vertical furnaces, however, since the cap 4 is simply cylindrical in shape and the exhaust port 1a is defined at only one location in the circumferential direction, there occurs in the vicinity of the upper end surface 4a of the cap 4 a difference in exhaust rate between a region A near the exhaust port 1a and other regions remote therefrom. As a result, the temperature in the region A where the exhaust rate increases is more likely to be lower than in the other regions.

This has raised a problem that in-plane variations and wafer to wafer variations in thickness and quality of thin films formed near the cap 4 inside the vertical furnace, and of wafers annealed at that location may become significant.

To overcome the above problem, prior systems have attempted to carry out the process while rotating the cap 4 within the process tube 1 for vertical furnaces. However, this method is accompanied by a high risk that the inner cavity of the process tube 1 may become contaminated by dust or dirt which is produced due to the presence of sliding parts in the process tube 1.

Another approach which has been used is the connection of a plurality of exhaust pipes 3 to the process tube 1 for vertical furnaces so that the exhaust flow will not be localized. However, this method raises the problem that the layout of the apparatus around the process tube 1 is complicated or because of the complication layout, the layout must be changed.

SUMMARY OF THE INVENTION

The present invention has been made to overcome the above-mentioned problems in the prior art, and its object is to provide a wafer process tube for vertical furnaces which can reduce in-plane variations and wafer to wafer variations in thickness and quality of thin films formed on wafers in the vertical furnaces, and of wafers annealed therein, by normalizing the gas flow rate within the process tube.

In accordance with one embodiment of the invention, a cap of heat insulating material is inserted into the vertical process tube with the upper surface of the cap being higher than the exhaust port of the tube. A groove of appropriate dimensions is formed around the outer circumferential surface of the cap in close proximity to the exhaust port of the tube. The flow resistance of the groove is lower than that of the gap between the inner wall of the process tube and the outer wall of the cap near the exhaust port of the tube. The flow resistance of the groove gradually increases, however, in proceeding circumferentially one hundred eighty (180) degrees about the cap from a position in close proximity with the exhaust port of the tube. Gas introduced into the process tube flows at a uniform rate between the inner circumference of the tube and the outer circumference of the cap to the exhaust port. Temperature variations caused from non-uniform gas flow rates thereby are prevented, and in-plane variations and wafer to water variations in thickness and quality of thin films formed on wafers and of wafers annealed may be controlled.

In another embodiment of the invention, the groove about the circumference of the cap is inclined such that the distance between the groove and the upper end surface of the cap gradually decreases in proceeding one hundred eighty (180) degrees about the outer circumference of the cap from a position in close proximity with the process tube exhaust port. The flow resistance between the tube and cap becomes smaller, while the flow resistance of the groove increases in proceeding one hundred eighty degrees along the groove from a position in close proximity to the exhaust port.

In yet another embodiment of the invention, an inclined ring of heat insulating material is fixed to the outer circumferential surface of the cap at a position higher than the exhaust port of the process tube, such that the distance between the ring and the upper face of the cap gradually decreases in proceeding one hundred eighty (180) degrees along the outer circumference of the cap from a position in close proximity with the exhaust port of the process tube. As gas flows from the top of the process tube downward between the inner wall of the tube and the outer wall of the cap toward the exhaust port of the tube, a high pressure region is formed above the ring, and a low pressure region is formed below the ring to normalize the rate of gas flow within the process tube.

In still another embodiment of the invention, a horizontal ring with a plurality of cutouts is fixed about the outer circumferential surface of the cap above the exhaust port of the process tube and near the upper end surface of the cap. The circumferential distance between ring cutouts gradually decreases in proceeding one hundred eighty (180) degrees about the outer circumference of the cap from a position in close proximity with the exhaust port of the process tube. In one alternative, the circumferential distance between cutouts may be held constant while the cross-sectional area of the cutouts is gradually increased in proceeding one hundred eighty (180) degrees about the circumference of the cap from a position in close proximity with the exhaust port of the process tube. In another alternative, a ring without cutouts has a vertical height which gradually decreases in proceeding one hundred eighty degrees about the ring from a position in closest proximity to the exhaust port. In a further alternative, a ring without cutouts has a horizontal width which gradually decreases in proceeding one hundred eighty degrees about the ring from a position in closest proximity to the exhaust port.

As gas flows from the top of the process tube downward between the inner wall of the process tube and the outer wall of the cap to the exhaust port of the tube, the gap between the ring and the inner surface of the process tube creates a gradually decreasing flow resistance in proceeding one hundred eighty (180) degrees about the circumference of the cap from a position in close proximity with the exhaust port. The gas flow rate thereby is normalized and temperature variations causing unacceptable in-plane wafer and wafer to wafer are avoided.

In a further embodiment, a passage is formed inside of the cap, with one end open at the center of the upper end surface of the cap, and the other end open to the outer circumferential surface of the cap at a position facing the exhaust port of the process tube. The passage includes a cavity near its upper end which acts as a buffer. By making the flow resistance of the passage less than the flow resistance encountered between the inner process tube wall and the outer cap wall, most gas flow to the exhaust port occurs through the passage. Variations in gas flow rates about the outer surfaces of the cap thereby are substantially reduced.

In yet a further embodiment of the invention, a horizontal, hollow annular ring is hermetically sealed about an outer circumferential surface of the process tube, and is physically connected to an exhaust port. Communication holes at equal circumferential distances apart are formed in the wall of the process tube, and in alignment with the annular pipe, to allow gas to pass from the interior of the process tube through the annular ring to the exhaust port. The cross-sectional area of the communication holes gradually increase in proceeding one hundred eighty degrees about the ring from a position in close proximity to the exhaust port. In the alternative, the plurality of communication holes in the above embodiment may be formed to have a gradually decreasing circumferential distance therebetween in proceeding circumferentially about the process tube from a position where the exhaust port of the tube is connected to the annular pipe. The cross-sectional area of the communication holes in this instance, however, remain equal in proceeding circumferentially from a position in closest proximity to the exhaust port. Flow resistance from the interior of the process tube through the communication holes to the annular ring thus decreases, while the flow resistance within the annular ring increases, in proceeding circumferentially one hundred eighty (180) degrees about the pipe from the exhaust port. The flow rate of gas circumferentially about the cap thereby is normalized.

For a better understanding of the present invention, reference may be had to the accompanying drawings wherein the same reference numbers have been applied to like parts.

DETAILED DESCRIPTION OF THE PREFERRED EMBODIMENTS

Preferred embodiments of the present invention will be described below with reference to the drawings.

FIRST EMBODIMENT OF INVENTION

Figure 1:
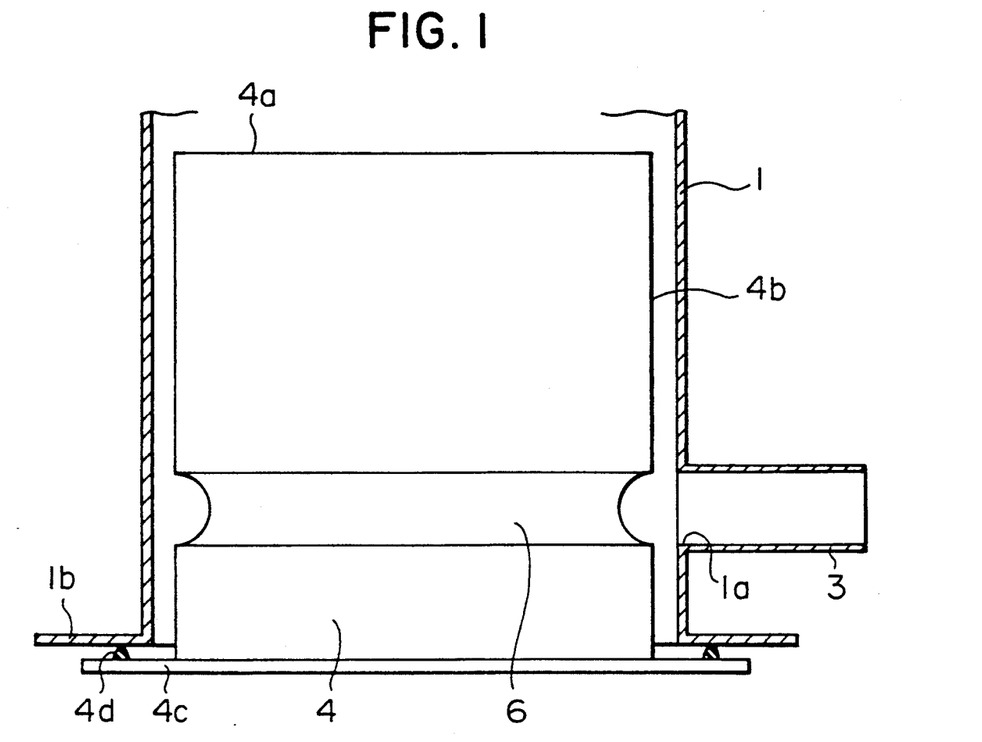
FIG. 1 is a side view, partially sectioned, showing the construction of a first embodiment of the present invention.

FIG. 1 shows a first embodiment of the present invention; i.e., it is a side view, partially sectioned, showing a condition that a cap 4 containing heat insulating material such as glass wool therein is inserted into an opening of a quartz-made, cylindrical process tube 1 for vertical furnaces at its lower end or bottom.

The construction of this embodiment will first be described.

An exhaust pipe 3 is connected to a peripheral wall of the process tube 1 at a position near the bottom opening for communication with an inner cavity of the tube through an exhaust port 1a formed at the same position. The cap 4 is inserted into the process tube 1 such that an upper end surface 4a of the cap 4 directed toward the inner cavity of the process tube 1 is positioned above the exhaust port 1a.

Thus, the exhaust port 1a faces an outer circumferential surface 4b of the cap 4.

Between a flange 1b formed to continuously outwardly project from the lower end of the process tube 1 and a flange 4c formed to continuously outwardly project from the lower end of the cap 4, there is interposed a ring-shaped sealing member 4d fixed to an upper surface of the flange 4c, thereby keeping air tightness. Additionally, as with the conventional cap shown in FIG. 12, a wafer mount boat is supported on the upper end surface 4a of cap 4.

Then, a groove 6 serving as exhaust flow uniformalizing or normalizing means is formed in the outer circumferential surface 4b of the cap 4.

Figure 2:
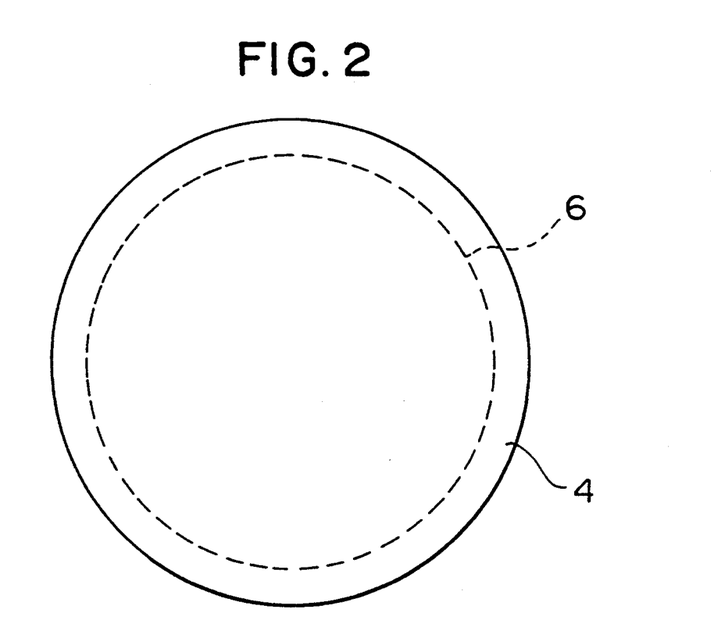
FIG. 2 is a top plan view of a cap in the first embodiment of the present invention.

As shown in the side view of FIG. 1 and the top plan view of FIG. 2, the groove 6 is of a groove defined continuously in the circumferential direction at the same level as the exhaust port 1a, and is formed by recessing the outer circumferential surface 4b of the cap 4 into a semicircular shape in cross-section. It is preferable that the cross-sectional area of flow passage defined by the groove 6 is comparable to or greater than that defined by the exhaust pipe 3.

Operation of this embodiment will now be described. Gas supplied to the process tube 1 flows downwardly and reaches the exhaust port 1a after passing the gap between the inner circumferential surface of the process tube 1 and the outer circumferential surface 4b of the cap 4, following which the gas is discharged to the exterior via the exhaust pipe 3.

With this embodiment, the groove 6 formed in the outer circumferential surface 4b of the cap 4 is positioned at the same level as the exhaust port 1a in opposite relation thereto, and the cross-sectional area of flow passage defined by the groove 6 is set to be relatively large.

The flow resistance of the groove is lower than that of the gap between the inner wall of the process tube and the outer wall of the cap near the exhaust port of the tube. The flow resistance of the groove gradually increases, however, in proceeding circumferentially one hundred eighty degrees about the cap from a position in close proximity to the exhaust port of the tube 1.

Therefore, the flow passage defined by the gap between the inner circumferential surface of the process tube 1 and the outer circumferential surface 4b of the cap 4 is subjected to substantially the same conditions around the entire circumference of the cap 4. As a result, the exhaust flow is permitted to uniformly flow into the entire gap between the inner circumferential surface of the process tube 1 and the outer circumferential surface 4b of the cap 4, whereby the exhaust flow is prevented from localizing.

Consequently, the localized temperature drop which has heretofore caused in-plane variations and wafer to wafer variations in quality of wafers located near the cap 4 can be prevented to improve yield of wafers.

In addition, since the construction of this embodiment only requires it to form the groove 6 in the outer circumferential surface 4b of the cap 4, a substantial increase in cost will not occur, and there is no need of changing the layout around the process tube 1, making the present invention easily adapted to existing equipment.

Furthermore, since there is no need of providing an additional rotating mechanism or the like, any risk of the inner cavity of the process tube 1 being contaminated by dust or dirt produced due to the presence of such a mechanism, will be avoided.

SECOND EMBODIMENT OF INVENTION

Figure 3:
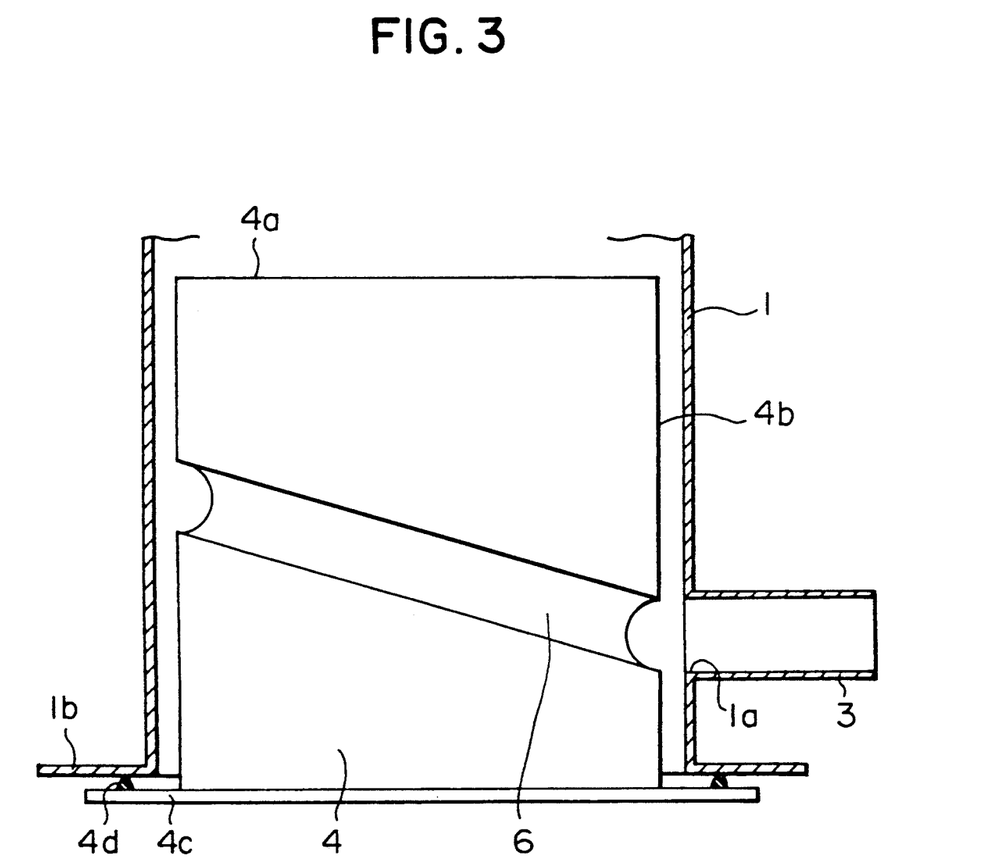
FIG. 3 is a side view, partially sectioned, showing the construction of a second embodiment of the present invention.

FIG. 3 shows a second embodiment of the present invention. It should be noted that certain elements of FIG. 3 correspond to those of FIG. 1 which illustrate the first embodiment, and those members and locations which are identical to those in FIG. 1 are denoted by the same reference numerals and their description already given above will not be repeated.

In this embodiment, the groove 6 formed as an exhaust flow uniformalizing or normalizing means in the outer circumferential surface 4b of the cap 4 is of a groove inclined such that the distance between itself and the upper end surface 4a of the cap 4 is gradually shortened as the groove spaces from the position facing the exhaust port 1a toward the opposite side in the circumferential direction.

To completely eliminate localization of the exhaust flow in the above construction of the first embodiment, the cross-sectional area of flow passage defined by the groove 6 is required to be so extremely large that flow resistance of the groove 6 can be perfectly ignored. In practice, therefore, there is a fear that the exhaust flow may be localized due to the flow resistance of the groove 6.

In this embodiment, however, since the groove 6 is inclined as mentioned above, the flow passage defined by the gap between the inner circumferential surface of the process tube 1 and the outer circumferential surface 4b of the cap 4 becomes shorter as it spaces from the position facing the exhaust port 1a.

Stated otherwise, by so inclining the groove 6, the flow passage leading from the inner cavity of the process tube 1 above the upper end surface 4a of the cap 4 to the groove 6 formed in the outer circumferential surface 4b of the cap 4 has flow resistance which becomes smaller as it spaces from the position facing the exhaust port 1a toward the opposite side in the circumferential direction, conversely to the flow resistance of the groove 6 itself. Therefore, by selecting an angle of inclination of the groove 6, the entire flow passage leading from the inner cavity of the process tube 1 to the exhaust port 1a is made uniform in flow resistance at any circumferential positions around the cap 4.

As a result, the exhaust flow in the process tube 1 is permitted to uniformly flow into the entire gap between the inner circumferential surface of the process tube 1 and the outer circumferential surface 4b of the cap 4, whereby the exhaust flow is reliably prevented from localizing.

The other operation and advantages of this embodiment are similar to those of the above first embodiment.

THIRD EMBODIMENT OF INVENTION

Figure 4:
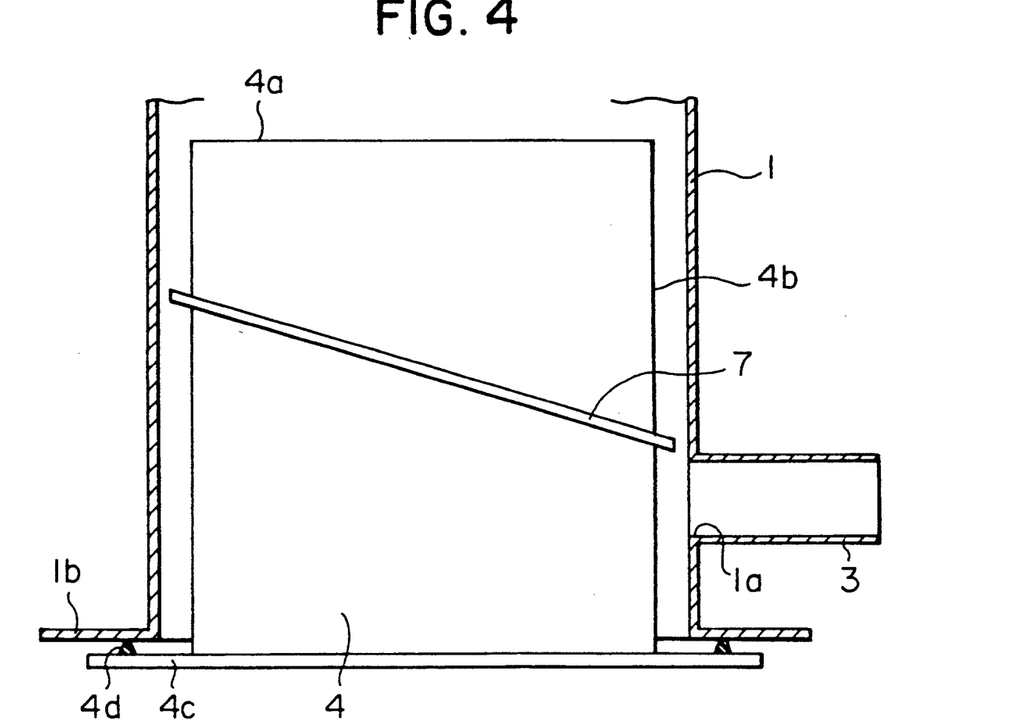
FIG. 4 is a side view, partially sectioned, showing the construction of a third embodiment of the present invention. 10
Figure 5:
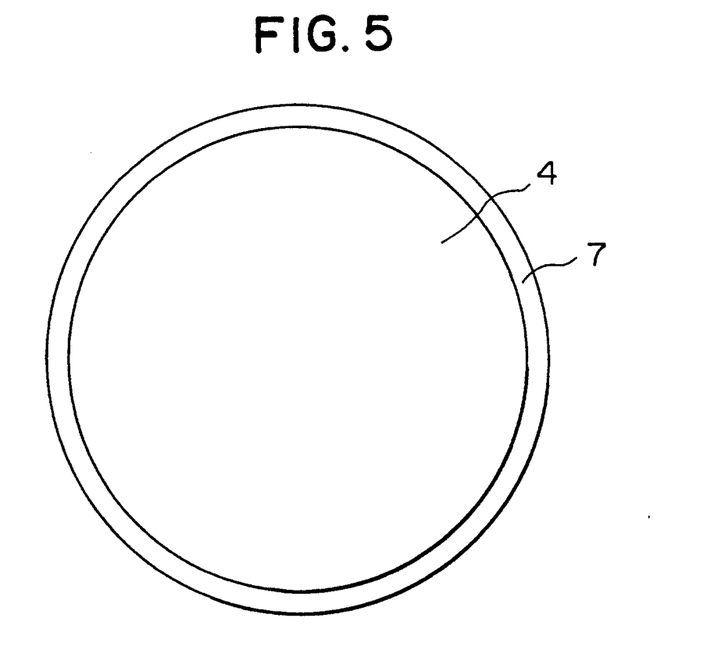
FIG. 5 is a top plan view of a cap in the third embodiment of the present invention.

FIGS. 4 and 5 show a third embodiment of the present invention. It should be noted that those members and locations which are identical to those in the above first and second embodiments are denoted by the same reference numerals, and their description already given above will not be repeated.

In this embodiment, a ring 7 serving as exhaust flow uniformalizing or normalizing means is fixed to the outer circumferential surface 4b of the cap 4. The ring 7 is fixed to the outer circumferential surface 4b of the cap 4 at a position higher than the exhaust port 1a such that the distance between itself and the upper end surface 4a of the cap 4 is gradually shortened as the ring spaces from the position facing the exhaust port 1a toward the opposite side in the circumferential direction.

With such an arrangement, the gap between the inner circumferential surface of the process tube 1 and the outer circumferential surface 4b of the cap 4 essentially functions as an orifice, so that a region under higher pressure is formed above the ring 7 and a region under lower pressure is formed below it.

Then, since the ring 7 is fixed in such a manner as to make shorter the distance between itself and the upper end surface 4a of the cap 4 as it spaces from the position facing the exhaust port 1a, the lower-pressure region is located nearer to the inner cavity of the process tube 1 at a position remoter from the exhaust port 1a, causing the exhaust flow to more easily flow into the gap. Therefore, the entire flow passage leading from the inner cavity of the process tube 1 to the exhaust port 1a is made uniform in flow resistance at any circumferential positions around the cap 4.

As a result, the exhaust flow in the process tube 1 is permitted to uniformly flow into the entire gap between the inner circumferential surface of the process tube 1 and the outer circumferential surface 4b of the cap 4, whereby the exhaust flow is prevented from localizing.

The other operation and advantages of this embodiment are similar to as those of the above first embodiment.

FOURTH EMBODIMENT OF INVENTION

Figure 6:
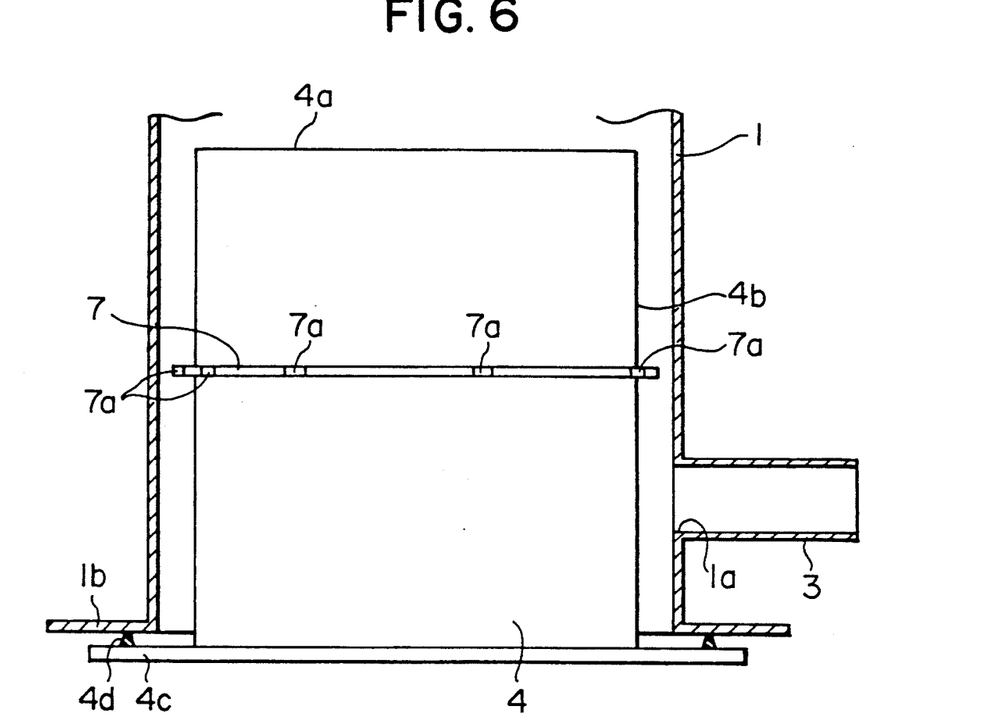
FIG. 6 is a side view, partially sectioned, showing the construction of a fourth embodiment of the present invention.
Figure 7:
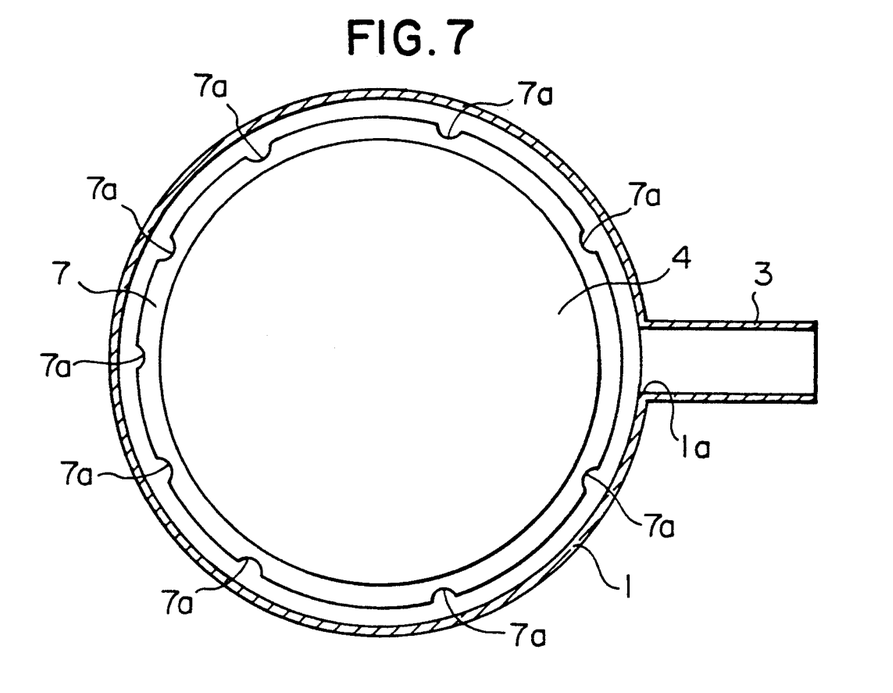
FIG. 7 is a top plan view, partially sectioned, showing the construction of a fourth embodiment of the present invention.

FIGS. 6 and 7 show a fourth embodiment of the present invention. It should be noted that those members and locations which are identical to those in the above first, second and third embodiments are denoted by the same reference numerals and their description already given above will not be repeated.

In this embodiment, a ring 7 is used as an exhaust flow uniformalizing or normalizing means similarly to the above third embodiment, but the ring 7 is horizontally fixed at a position higher than the exhaust port 1a.

The ring 7 has a plurality of cutouts 7a, . . . , 7a formed therein such that the interval between these cutouts is gradually shortened as the ring spaces from the position facing the exhaust port 1a toward the opposite side in the circumferential direction.

With such an arrangement, a region under higher pressure is formed above the ring 7 and a region under lower pressure is formed below it, as with the above third embodiment. In addition, since the cutouts 7a, . . . , 7a are formed at the positions as explained above, the gap between the inner circumferential surface of the process tube 1 and the outer circumferential surface 4b of the cap 4 has flow resistance which becomes smaller as it spaces from the position facing the exhaust port 1a toward the opposite side in the circumferential direction, causing the exhaust flow to more easily flow into the gap at locations remoter from the exhaust port 1a.

Therefore, the entire flow passage leading from the inner cavity of the process tube 1 to the exhaust port 1a is made uniform in flow resistance at any circumferential positions around the cap 4. As a result, the exhaust flow in the process tube 1 is permitted to uniformly flow into the entire gap between the inner circumferential surface of the process tube 1 and the outer circumferential surface 4b of the cap 4, whereby the exhaust flow is prevented from localizing.

While, in this embodiment, the gap between the inner circumferential surface of the process tube 1 and the outer circumferential surface 4b of the cap 4 is made to have smaller flow resistance as it spaces from the position facing the exhaust port 1a toward the opposite side in the circumferential direction, by forming the plurality of cutouts 7a, . . . , 7a in the ring such that the interval between these cutouts is gradually shortened as the cutout spaces from the position facing the exhaust port 1a toward the opposite side in the circumferential direction, the arrangement for making smaller the flow resistance of the aforesaid gap with the increasing distance from the exhaust port 1a is not limited to that of the illustrated embodiment. For example, the plurality of cutouts 7a, . . . , 7a may be formed in the ring 7 such that the interval between these cutouts 7a, . . . , 7a is set to be constant, but the opening area of the cutouts is gradually enlarged as the cutout spaces from the position facing the exhaust port 1a toward the opposite side in the circumferential direction. Alternatively, the ring 7 may be formed to have a smaller thickness or a narrower width as it spaces from the position facing the exhaust port 1a toward the opposite side in the circumferential direction.

The other operation and advantages of this embodiment are similar to those of the above first embodiment.

FIFTH EMBODIMENT OF INVENTION

Figure 8:
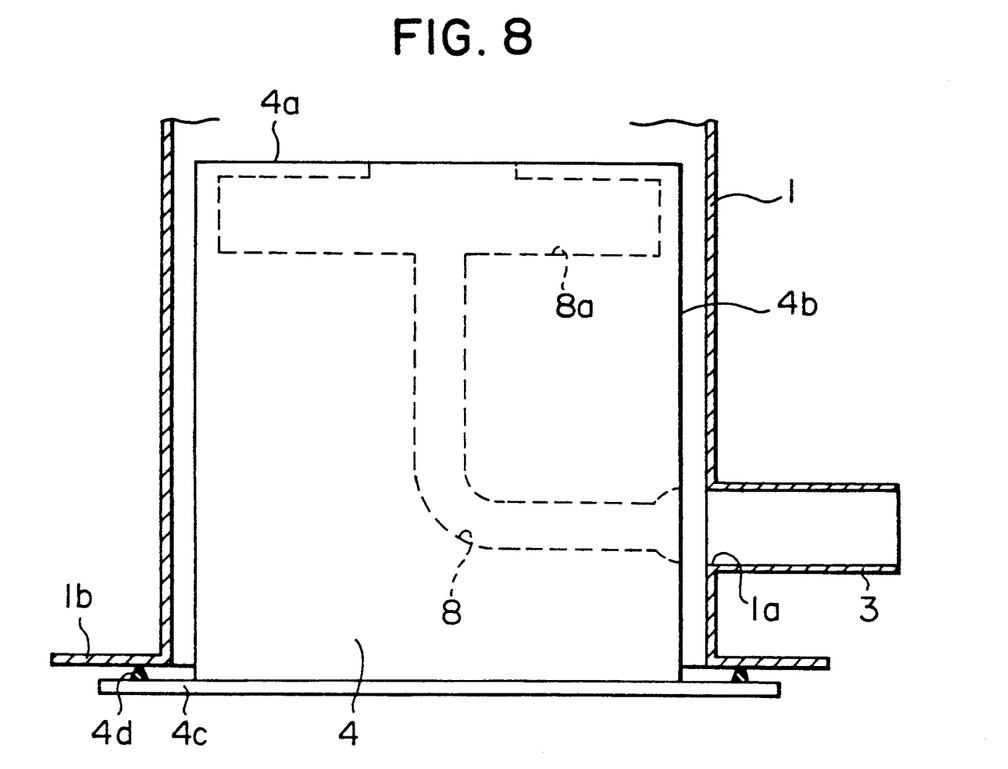
FIG. 8 is a side view, partially sectioned, showing the construction of a fifth embodiment of the present invention.
Figure 9:
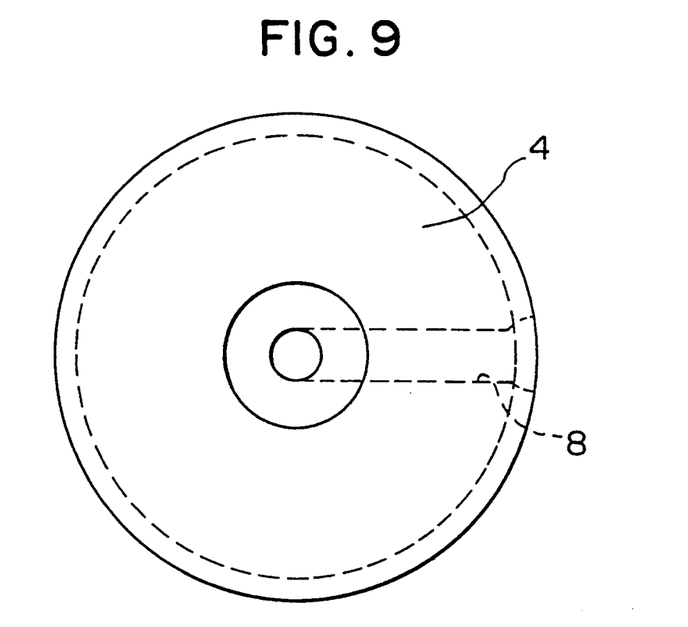
FIG. 9 is a top plan view, partially sectioned, of a cap in the fifth embodiment of the present invention.

FIGS. 8 and 9 show a fifth embodiment of the present invention. It should be noted that those members and locations which are identical to those in the above embodiments are denoted by the same reference numerals, and their description already given above will not be repeated.

In this embodiment, a passage 8 is formed as exhaust flow uniformalizing means in the cap 4. The passage 8 has one end being open in the upper end surface 4a of the cap 4 at the center thereof, and the other end being open in the outer circumferential surface 4b of the cap 4 at a position facing the exhaust port 1a.

Additionally, the passage 8 has a cavity portion 8a, of which diameter is larger than the other portion, near its opening in the upper end surface 4a.

With such an arrangement, by setting the flow resistance of the passage 8 to be smaller than that of the gap between the inner circumferential surface of the process tube 1 and the outer circumferential surface 4b of the cap 4, most of the exhaust flow is forced to reach the exhaust port 1a through the passage 8 opening at the center of the upper end surface 4a, whereby the exhaust flow is prevented from localizing.

Further, in this embodiment, the cavity portion 8a is defined midway the passage 8 near its upstream end to serve as a buffer. Therefore, the region where the exhaust rate is rapidly increased exists inside the cap, which is effective to make smaller in-plane variations and wafer to wafer variations in quality of wafers and so on.

The position where the one end of the passage 8 opens in the upper end surface 4a is not limited to the center of the upper end surface 4a. Alternatively, the passage 8 may open in a scattered patter over the upper end surface 4a.

The other operation and advantages of this embodiment are similar to those of the above first embodiment.

SIXTH EMBODIMENT OF INVENTION

Figure 10:
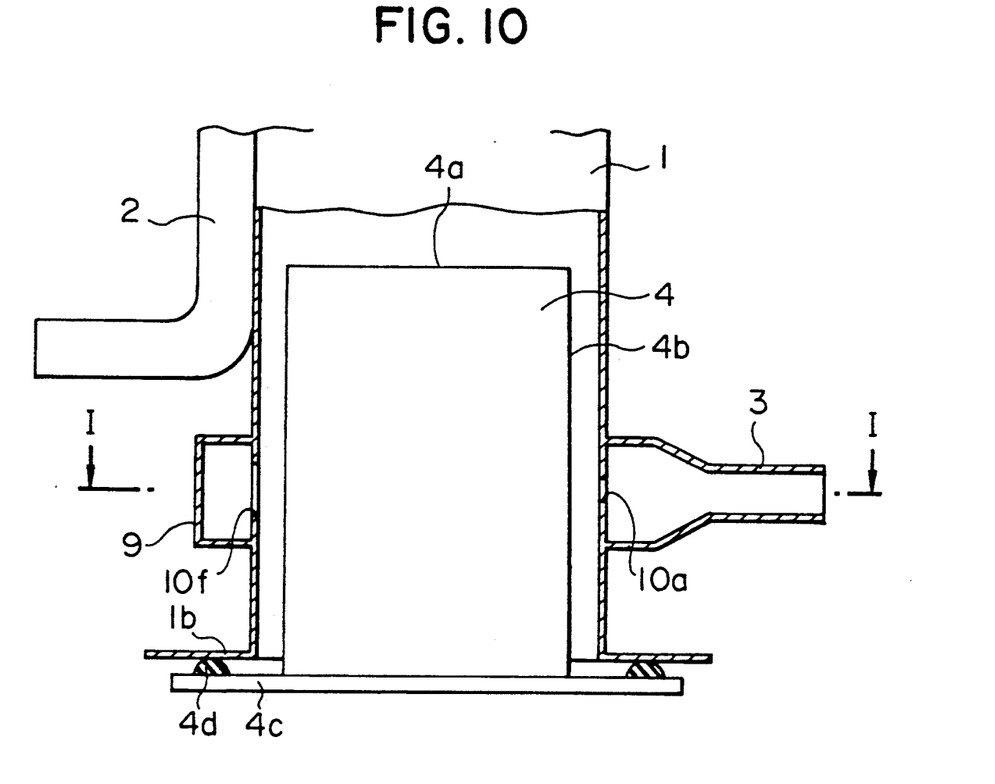
FIG. 10 is a side view, partially sectioned, showing the construction of a sixth embodiment of the present invention.
Figure 11:
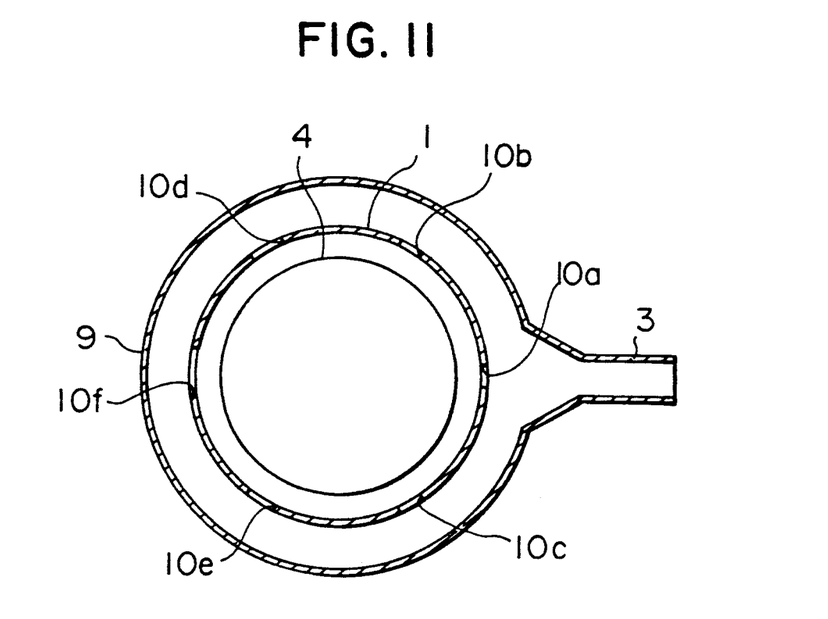
FIG. 11 is a sectional view taken along line I—I in FIG. 10.

FIGS. 10 and 11 show a sixth embodiment of the present invention. FIG. 10 is a side view, partially sectioned, showing the vicinity of the exhaust end of the process tube 1, and FIG. 11 is a sectional view taken along line I—I of FIG. 10. It should be noted that those members and locations which are identical to those in the above embodiments are denoted by the same reference numerals, and their description already given above will not be repeated.

In this embodiment, the process tube 1 is formed into a horizontal, double-wall tube or hollow annular ring in a part of the outer circumferential surface near its exhaust end, thereby forming an annular ring 9 which surrounds an axially central portion of the outer circumferential surface 4b of the cap 4.

The annular ring 9 is connected to the exhaust pipe 3 at one location in the circumferential direction for communication therebetween.

Further, the interior of the annular ring 9 is communicated with the inner cavity of the process tube 1 via six communication holes 10a to 10f.

These communication holes 10a to 10f are formed at six locations with a constant interval in the circumferential direction starting from the position facing the exhaust pipe 3. More specifically, of the communication holes 10a to 10f, the communication hole 10a formed at the position facing the exhaust pipe 3 has a minimum opening area. With the increasing distance from the exhaust pipe 3 in the circumferential direction, the opening area of the remaining communication holes becomes larger in the order of 10b, 10c and 10d, 10e on the opposite sides. The communication hole 10f formed at the position angularly spaced 180 degrees from the position facing the exhaust pipe 3 has a maximum opening area.

Therefore, the area through which the process tube 1 and the annular ring 9 are communicated with each other is increased as the annular ring spaces from the position, where the exhaust pipe 3 is connected to the annular ring 9, toward the opposite side in the circumferential direction.

Operation of this embodiment will now be described.

Gas supplied to the process tube 1 through the process gas introducing pipe 2 flows downwardly and reaches the annular ring 9 after passing the gap between the inner circumferential surface of the process tube 1 and the outer circumferential surface 4b of the cap 4 and the communication holes 10a to 10f, following which the gas is discharged to the exterior via the exhaust pipe 3.

As a result of selecting the opening areas of the communication holes 10a to 10f as explained above, the area. through which the process tube 1 and the annular ring 9 are communicated with each other is increased at the locations remoter from the exhaust pipe 3 and, therefore, the flow passage leading from inner cavity of the process tube 1 to the interior of the annular ring 9 has smaller flow resistance at the locations remoter from the exhaust pipe 3.

On the other hand, the flow resistance of the annular ring 9 between an arbitrary circumferential position thereof and the position where it is connected to the exhaust pipe 3, is larger at the locations remoter from the exhaust pipe 3 because that flow resistance is in proportion to the distance from the position where the annular ring 9 is connected to the exhaust pipe 3.

Stated otherwise, the flow resistance of the communication holes 10a to 10f and the flow resistance of the annular ring 9 itself exhibit characteristics reversed to each other, taking as a variable the distance from the position where the annular ring 9 is connected to the exhaust pipe 3. Thus, by appropriately selecting the opening areas of the communication holes 10a to 10f and the passage diameter of the annular ring 9, the entire flow passage leading from the inner cavity of the process tube 1 to the exhaust pipe 3 is made uniform in flow resistance at any circumferential positions around the cap 4.

As a result, the exhaust flow in the process tube 1 is permitted to uniformly flow into the entire gap between the inner circumferential surface of the process tube 1 and the outer circumferential surface 4b of the cap 4, whereby the exhaust flow is prevented from localizing.

Consequently, the localized temperature drop which has heretofore caused in-plane variations and wafer to wafer variations in thickness of thin films formed on wafers near the cap 4 and the thickness of wafers annealed near cap 4 can be prevented to improve yield of wafers.

In addition, since the construction of this embodiment only requires it to modify the configuration of peripheral wall of the conventional process tube 1 near its exhaust side end, a substantial increase in the cost will not result, and there is no need of changing the apparatus layout around the process tube 1, making the present invention easily adaptable to existing equipment.

Furthermore, since there is no need for providing an additional rotating mechanism or the like, any risk that the inner cavity of the process tube 1 may be contaminated by dust or dirt produced due to the presence of such a rotating mechanism is eliminated.

While, in this embodiment, the area through which the process tube 1 and the annular ring 9 are communicated with each other is gradually increased as the annular ring spaces in the circumferential direction from the position where the exhaust pipe 3 is connected to the annular ring 9, by selecting the opening areas of the communication holes 10a to 10f formed with a constant interval to become larger at the locations remoter from the exhaust pipe 3, the construction for making that communication area larger at the locations remoter from the exhaust pipe 3 is not limited to the illustrated embodiment. For example, the inner cavity of the process tube 1 may be communicated with the annular ring 9 through a plurality of communication holes formed such that the interval between these communication holes is narrowed as the annular ring spaces in the circumferential direction from the position where the exhaust pipe 3 is connected to the annular ring 9. In this instance, however, the cross-sectional areas of the communication holes remain equal in proceeding about the ring.

As an example of experiments conducted in creating the above embodiments, a vertical furnace which has the process tube 1 according to the above second embodiment of the present invention was used, and an oxide film was formed all over the surface of an 8-inch wafer by setting a target thickness to 12 nm. As a result, variations in thickness of the oxide film in the wafer plane could be held down in the range of 3 to 2% in contrast with the range of 5 to 3% in the prior art. Also, variations in thickness of the oxide film from wafer to wafer could be held down in the range of 3 to 2% in contrast with the range of 5 to 3% in the prior art. Consequently, yield of wafers was improved 10% in comparison with the case using the prior art vertical furnace.

It should be noted that the above variations in thickness of the oxide film was calculated from the following formula:

$$\frac{\text{max. film thickness} - \text{min. film thickness}}{\text{max. film thickness} + \text{min. film thickness}} \times 100(\%)$$

According to the present invention, as fully described above, there can be obtained advantages that the exhaust flow in the process tube for vertical furnaces is prevented from localizing and, as a result, in-plane variations and wafer to wafer variations in thickness and quality of wafers subjected to film forming and annealing are reduced.

In support of the semi-conductor wafer claims of this application, we refer and incorporate by reference the wafer structural teachings of S. M. Sze as set forth in the book entitled *"Physics of Semiconductor Devices"*, second edition, Wiley-Interscience, with 1981 Copyright.

While there has been illustrated and described what is at present considered to be the preferred embodiments of the present invention, it will be appreciated that numerous changes and modifications are likely to occur to those skilled in the art, and it is intended to cover in the appended claims all those changes and modifications which fall within the true spirit and scope of the present invention.

What is claimed is:

1. An apparatus for normalizing gas flow rates in a wafer process tube of a vertical furnace, wherein said tube has a lower open end and an upper end enclosed about a gas inlet, and further has an exhaust port in a wall of said tube near said open end, which comprises:
   a cap inserted into said open end, but spaced apart from said tube with an upper end surface of said cap located above said exhaust port, and a lower end surface of said cap hermetically sealed to said open end below said exhaust port, said cap having a groove about the circumference of said cap, with said groove having a diameter at least equal to that of said exhaust port and located vertically in close proximity to said exhaust port.

2. The apparatus set forth in claim 1 above, wherein said groove is horizontal.

3. The apparatus set forth in claim 1 above, wherein said groove is inclined with the lowest part of said groove in close proximity to said exhaust port.

4. An apparatus for normalizing gas flow rates in a wafer process tube of a vertical furnace, wherein said tube has a lower open end and an upper end enclosed about a gas inlet, and further has an exhaust port in a wall of said tube near said open end, which comprises a cap inserted into said open end but spaced apart from said tube, with an upper end surface of said cap located above said exhaust port, and a lower end surface of said cap hermetically sealed to said open end below said exhaust port, said cap having an inclined ring fixed about the outer circumference of said cap with the lowest part of said ring in close proximity to said exhaust port.

5. An apparatus for normalizing gas flow rates in a wafer process tube of a vertical furnace, wherein said tube has a lower open end and an upper end enclosed about a gas inlet, and further has an exhaust port in a wall of said tube near said open end, which comprises a cap inserted into said open end but spaced apart from said tube, with an upper end surface of said cap located above said exhaust port, and a lower end surface of said cap hermetically sealed to said open end below said exhaust port, said cap having horizontal ring means fixed to the outer circumference of said cap and located above said exhaust port near said upper end surface for equalizing flow resistance encountered by a gas flowing from said gas inlet to said exhaust port.

6. The apparatus set forth in claim 5, wherein said horizontal ring means comprises a ring having a plurality of spaced apart cutout regions of uniform cross-sectional area, with the circumferential distance between such cutout regions gradually decreasing in proceeding one hundred eighty (180) degrees around said ring from a position in closest proximity to said exhaust port.

7. The apparatus set forth in claim 5, wherein said horizontal ring means comprises a ring having a plurality of cutout regions which are spaced apart by an equal circumferential distance, and which have cross-sectional areas that gradually increase in proceeding one hundred eighty degrees around said ring from a position in closest proximity to said exhaust port.

8. The apparatus set forth in claim 5, wherein said horizontal ring means comprises a ring with the vertical height of said ring gradually decreasing in proceeding one hundred eighty degrees around said ring from a position in closest proximity to said exhaust port.

9. The apparatus set forth in claim 5, wherein said horizontal ring means comprises a ring with the horizontal width of said ring gradually decreasing in proceeding one hundred eighty degrees around said ring from a position in closest proximity to said exhaust port.

10. An apparatus for normalizing gas flow rates in a wafer process tube of a vertical furnace, wherein said tube has a lower open end and an upper end enclosed about a gas inlet, and further has an exhaust port in a wall of said tube near said open end, which comprises:
    a cap inserted into said open end, but spaced apart from said tube, with an upper end surface of said cap located above said exhaust port, and a lower end surface of said cap hermetically sealed to said open end below said exhaust port, said cap having an interior passage with a first open end centrally located in said upper end surface and a second open end located in the outer circumferential surface of said cap in close proximity to said exhaust port.

11. The apparatus set forth in claim 10 above, with said passage having a cavity near said first open end and of diameter larger than that of said first open end.

12. A method for normalizing gas flow rates in a wafer process tube of a vertical furnace, said tube having a lower open end, an upper end enclosed about a gas inlet, and an exhaust port in a wall of said tube near said open end, comprising the steps of:
    inserting a cap through said open end and into but spaced apart from said tube, with an upper end surface of said cap located above said exhaust port;
    hermetically sealing a lower end surface of said cap to said open end to avoid leakage of gas from said tube; and
    altering the outer circumferential surface of said cap to normalize gas flow rates between said gas inlet and said exhaust port.

13. The method set forth in claim 12, wherein the step of altering includes: forming a groove having a diameter at least equal to that of said exhaust port about the circumference of said cap and in close proximity to said exhaust port.

14. The method set forth in claim 13, wherein said groove is horizontal.

15. The method set forth in claim 13 wherein said groove is inclined with the lowest part of said groove in close proximity to said exhaust port.

16. The method set forth in claim 12, wherein the step of altering includes: fixing a ring about the outer circumference of said cap.

17. The method set forth in claim 16, wherein said ring is inclined with a lowest part of said ring in close proximity to said exhaust port.

18. The method set forth in claim 16, wherein said ring is horizontal and located above said exhaust port near said upper end surface.

19. The method set forth in claim 18, further comprising the steps of removing a plurality of regions from said ring, wherein said regions are spaced apart by equal circumferential distances, and said regions have cross-sectional areas that gradually increase in proceeding one hundred eighty degrees around said ring from a position in closest proximity to said exhaust port.

20. The method set forth in claim 18, further comprising the step of shaping said ring in vertical height such that said ring gradually decreases in vertical height in proceeding one hundred eighty degrees around said ring form a position in closest proximity to said exhaust port.

21. The method set forth in claim 18, further comprising the step of shaping said ring in horizontal width such that said ring gradually decreases in horizontal width in proceeding one hundred eighty degrees around said ring from a position in closes proximity to said exhaust port.

22. The method set forth in claim 12, wherein the step of altering includes forming an interior passage through said cap with a first open end of said passage located centrally in said upper end surface and a second open end located in the outer circumferential surface of said cap in close proximity to said exhaust port.

23. The method set forth in claim 22, further including the step of forming a cavity in said cap having a diameter larger than that of said first open end and axially aligned with said passage near said first open end.

* * * * *